(12) United States Patent
Imamura et al.

(10) Patent No.: US 10,292,099 B2
(45) Date of Patent: May 14, 2019

(54) TRANSMISSION APPARATUS, RECEPTION APPARATUS, COMMUNICATION SYSTEM, TRANSMISSION METHOD, AND RECEPTION METHOD

(71) Applicant: Panasonic Corporation, Osaka (JP)

(72) Inventors: Koji Imamura, Shiga (JP); Takayuki Abe, Tokyo (JP)

(73) Assignee: Panasonic Corporation, Osaka (JP)

( * ) Notice: Subject to any disclaimer, the term of this patent is extended or adjusted under 35 U.S.C. 154(b) by 359 days.

(21) Appl. No.: 14/403,929

(22) PCT Filed: Mar. 6, 2014

(86) PCT No.: PCT/JP2014/001255
§ 371 (c)(1),
(2) Date: Nov. 25, 2014

(87) PCT Pub. No.: WO2014/141646
PCT Pub. Date: Sep. 18, 2014

(65) Prior Publication Data
US 2015/0139055 A1 May 21, 2015

(30) Foreign Application Priority Data

Mar. 11, 2013 (JP) ................................. 2013-048351

(51) Int. Cl.
*H04W 52/02* (2009.01)
*H04W 74/04* (2009.01)
(Continued)

(52) U.S. Cl.
CPC .......... *H04W 52/0209* (2013.01); *H03C 3/00* (2013.01); *H03D 3/02* (2013.01);
(Continued)

(58) Field of Classification Search
CPC .......... H04W 52/0209; H04W 72/0453; H04L 25/02; H04L 27/06; H04L 27/04; H03C 3/03; H03D 3/02
(Continued)

(56) References Cited

U.S. PATENT DOCUMENTS 5,493,583 A * 2/1996 Cripps ................. H03C 3/0975
375/219
6,061,388 A * 5/2000 Saulnier ................. H04B 1/707
375/130
(Continued)

FOREIGN PATENT DOCUMENTS

JP 9-321893 A 12/1997
JP 2000-22576 A 1/2000
(Continued)

OTHER PUBLICATIONS

International Search Report, dated Apr. 1, 2014, for International Application No. PCT/JP2014/001255, 4 pages.

*Primary Examiner* — Ricky Q Ngo
*Assistant Examiner* — Ellen A Kirillova
(74) *Attorney, Agent, or Firm* — Seed IP Law Group LLP

(57) ABSTRACT

Provided is a transmission apparatus capable of reducing power consumption of a reception apparatus. The transmission apparatus includes a modulator that modulates a data signal to generate a transmission signal. The modulator modulates the data signal by assigning the data signal to a frequency difference between a first frequency and a second frequency in a carrier.

10 Claims, 13 Drawing Sheets

(51) Int. Cl.
*H04L 27/06* (2006.01)
*H04L 25/02* (2006.01)
*H04L 27/04* (2006.01)
*H04W 72/04* (2009.01)
*H03C 3/00* (2006.01)
*H03D 3/02* (2006.01)
*H04L 27/10* (2006.01)

(52) U.S. Cl.
CPC .............. *H04L 25/02* (2013.01); *H04L 27/04* (2013.01); *H04L 27/06* (2013.01); *H04W 72/0453* (2013.01); *H04L 27/10* (2013.01); *Y02D 70/00* (2018.01); *Y02D 70/21* (2018.01)

(58) Field of Classification Search
USPC ......................................................... 370/311
See application file for complete search history.

(56) References Cited

U.S. PATENT DOCUMENTS

| | | | |
|---|---|---|---|
| 2002/0180523 A1* | 12/2002 | Okubo ................. | H03F 1/3205 330/149 |
| 2004/0037560 A1* | 2/2004 | Mells ................. | H04B 10/2572 398/76 |
| 2006/0008085 A1 | 1/2006 | Matsuo | |
| 2006/0111073 A1* | 5/2006 | Ogawa ................... | H03D 3/007 455/312 |
| 2007/0237258 A1* | 10/2007 | Shakeshaft .............. | H03C 5/00 375/296 |
| 2009/0213942 A1 | 8/2009 | Holm et al. | |
| 2009/0279389 A1* | 11/2009 | Irie ......................... | G01S 7/003 367/118 |
| 2010/0069992 A1* | 3/2010 | Aghassian ......... | A61N 1/37229 607/32 |
| 2010/0279614 A1* | 11/2010 | Hagiwara ................ | H04B 1/74 455/42 |
| 2011/0019783 A1* | 1/2011 | Nakano ................ | H03H 11/126 375/344 |
| 2011/0222592 A1* | 9/2011 | Asami ................ | H04L 27/0014 375/226 |

FOREIGN PATENT DOCUMENTS

| | | |
|---|---|---|
| JP | 2005-94195 A | 4/2005 |
| JP | 2004-336720 A | 9/2005 |
| JP | 2008-160207 A | 7/2008 |
| JP | 2009-518918 A | 5/2009 |

* cited by examiner

FIG.7
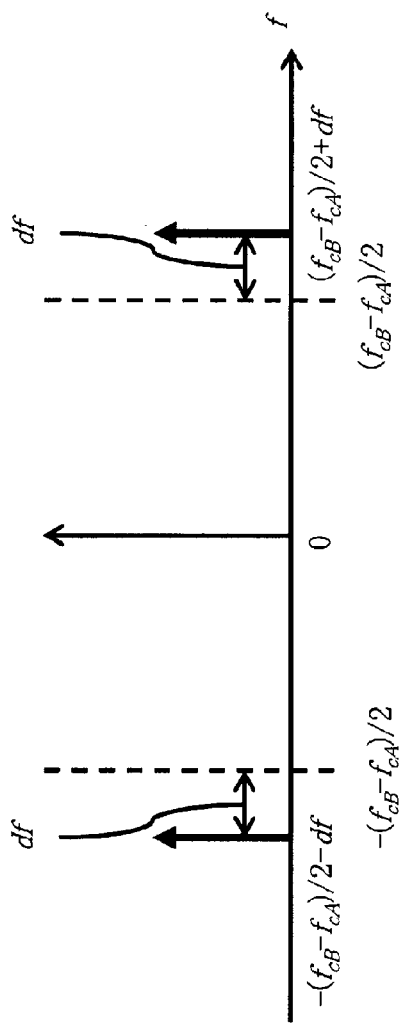
(A)
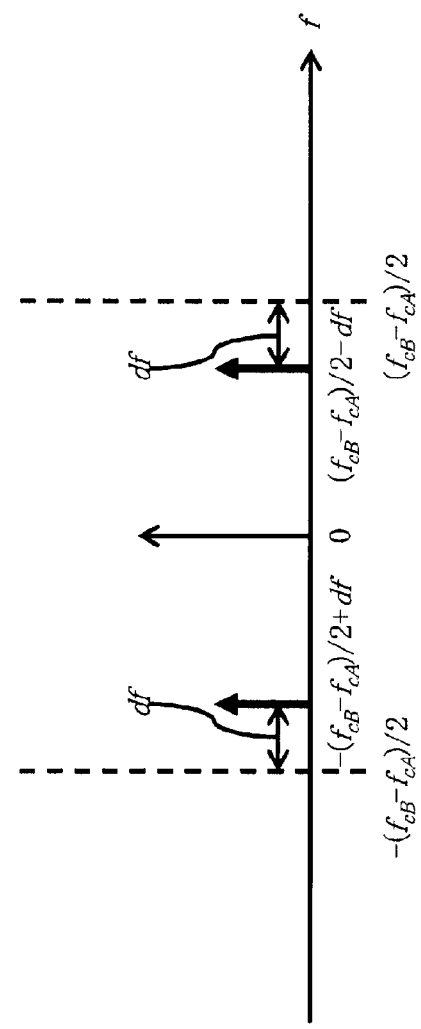
(B)

TRANSMISSION APPARATUS, RECEPTION APPARATUS, COMMUNICATION SYSTEM, TRANSMISSION METHOD, AND RECEPTION METHOD

TECHNICAL FIELD

The present disclosure relates to a transmission apparatus, a reception apparatus, a communication system, a transmission method, and a reception method.

BACKGROUND ART

In general, a reception apparatus including a mixer, an signal oscillator, a frequency offset estimator, and a demodulator has been known (for example, see Patent Literature 1). The mixer frequency-converts a reception signal into a baseband signal by multiplying the reception signal and a Local Oscillator (LO) signal. The LO signal oscillator adds frequency offset compensation information to information of a predetermined frequency and generates the LO signal. The frequency offset estimator estimates a frequency difference between the information of the predetermined frequency and a center frequency of the reception signal, and generates frequency offset information. The demodulator demodulates the baseband signal.

CITATION LIST

Patent Literature

Patent Literature 1: JP-A-2000-22576

SUMMARY OF INVENTION

Technical Problem

In Patent Literature 1, it is difficult to reduce power consumption of a reception apparatus.

The present disclosure has been made in view of the above circumstances, and provides a transmission apparatus, a reception apparatus, a communication system, a transmission method, and a reception method, which are capable of reducing power consumption of the reception apparatus.

Solution to Problem

A transmission apparatus according to the present disclosure includes a modulator that modulates a data signal to generate a transmission signal, in which the modulator modulates the data signal by assigning the data signal to a frequency difference between a first frequency and a second frequency in a carrier.

Advantageous Effects of Invention

According to the present disclosure, it is possible to reduce power consumption of a reception apparatus.

BRIEF DESCRIPTION OF DRAWINGS

In FIG. 7, (A) and (B) are schematic diagrams each illustrating an example of a transmission frequency spectrum of a baseband signal in the second embodiment.

DESCRIPTION OF EMBODIMENTS

Hereinafter, embodiments of the present disclosure will be described with reference to the drawings.

(Background of Aspect of Present Disclosure)

Recently a wireless network between sensors which separately collect, for example, state information between apparatuses or sensing information has attracted attention. The wireless network includes, for example, a system performing Machine to Machine (M2M) communication or a sensor wireless network system.

Since wireless sensor terminals used in the wireless network are effective when the wireless terminals can be used without a limitation and concern, it is necessary to reduce a size and a weight, and to allow operation for an extended time of several years by being driven by a battery. Notably, not only the operation time of a wireless sensor terminal, but also the size or weight of the wireless sensor terminal itself is dominating a battery capacity. In order to extend the operation time without changing the size or weight of the wireless sensor terminal, it is important to reduce power consumption of the entire wireless sensor terminal.

The wireless sensor terminal is mainly configured with a microcontroller unit, a sensor unit, a power controller, and a wireless unit. Especially, the wireless unit always operates in order to receive control information from abuse station all the time, and this results in high power consumption. The power consumed by the wireless sensor terminal during the reception is, for example, an order of a few tens of milliwatts.

Next, the reception apparatus described in Patent Literature 1 will be explained. The reception apparatus of Patent Literature 1 includes an antenna, a Low Noise Amplifier (LNA), a mixer, an LO signal oscillator, a filter, a frequency offset estimator, and a demodulator.

Figure 13:
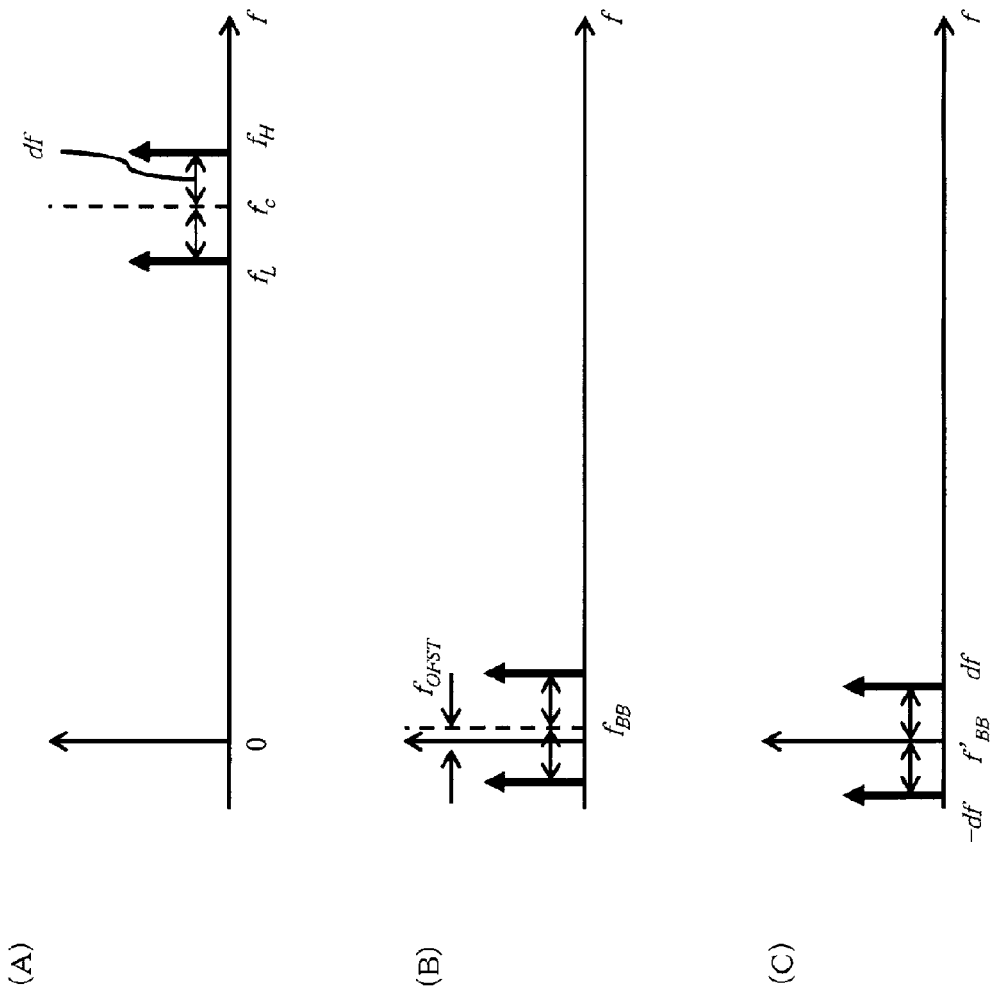
In FIG. 13, (A) to (C) are schematic diagrams each illustrating an example of a reception frequency spectrum of a signal received by a reception apparatus in the related art.

In FIG. 13, (A) to (C) are schematic diagrams each illustrating a change in a frequency spectrum of a reception signal in the reception apparatus described in Patent Literature 1.

In (A) of FIG. 13, the reception signal received by the antenna is frequency-modulated, in which the center frequency is a frequency $f_C$, for example, data 0 has $f_L=f_C-df$, and for example data 1 has $f_H=f_C+df$. The reception signal is multiplied by an LO signal of a frequency $f_{LO}$ in the mixer, and is converted into a signal with a baseband frequency $f_{BB}=f_C-f_{LO}$ as a center frequency, as illustrated in (B) of FIG. 13.

In addition, the reference frequency and the reception frequency of a transmission apparatus do not match in an initial state. Therefore, a frequency offset $f_{OFST}$ is estimated by the frequency offset estimator, and the LO signal is corrected by the frequency offset $f_{OFST}$. Thus, as illustrated in (C) of FIG. 13, $f_{BB}$ is a desired frequency ((C) of FIG. 13), and the data signal is demodulated by a demodulator.

The reception apparatus described in Patent Literature 1 requires the mixer, the LO signal oscillator, and the frequency offset estimator. For example, when the LO signal oscillator is designed to have high accuracy, it is difficult for the LO signal oscillator to consume power of, for example, a microwatt order during reception, and thus it is difficult to reduce power consumption in the reception apparatus.

Hereinafter, a transmission apparatus, a reception apparatus, a communication system, a transmission method, and a reception method, which are capable of reducing power consumption of the reception apparatus, will be described.

The transmission apparatus and the reception apparatus in the following embodiments are included in, for example, a wireless network between sensors separately collecting state information between apparatuses or sensing information. The wireless network includes, for example, a system that performs Machine to Machine (M2M) communication or a sensor wireless network system.

In the following embodiments, for example, a frequency modulation scheme (Frequency Shift Keying: FSK) is assumed as a modulation scheme of the transmission apparatus and reception apparatus.

In the case of using frequency modulation, the influence of amplitude fluctuations due to natural phenomena (for example, fading) to the demodulation characteristics is smaller when the frequency modulation is compared to, for example, an amplitude modulation. Further, a frequency modulation signal is a low envelope signal with small signal power, and the power efficiency of a power amplifier with high power consumption in the transmission apparatus is higher. Further, even in the reception apparatus, the amplitude variation does not affect the demodulation characteristics, and thus the gain control is easy during reception.

In the following embodiments, the transmission apparatus and the reception apparatus are connected through a communication line, not shown, to form a communication system.

First Embodiment

Figure 1:
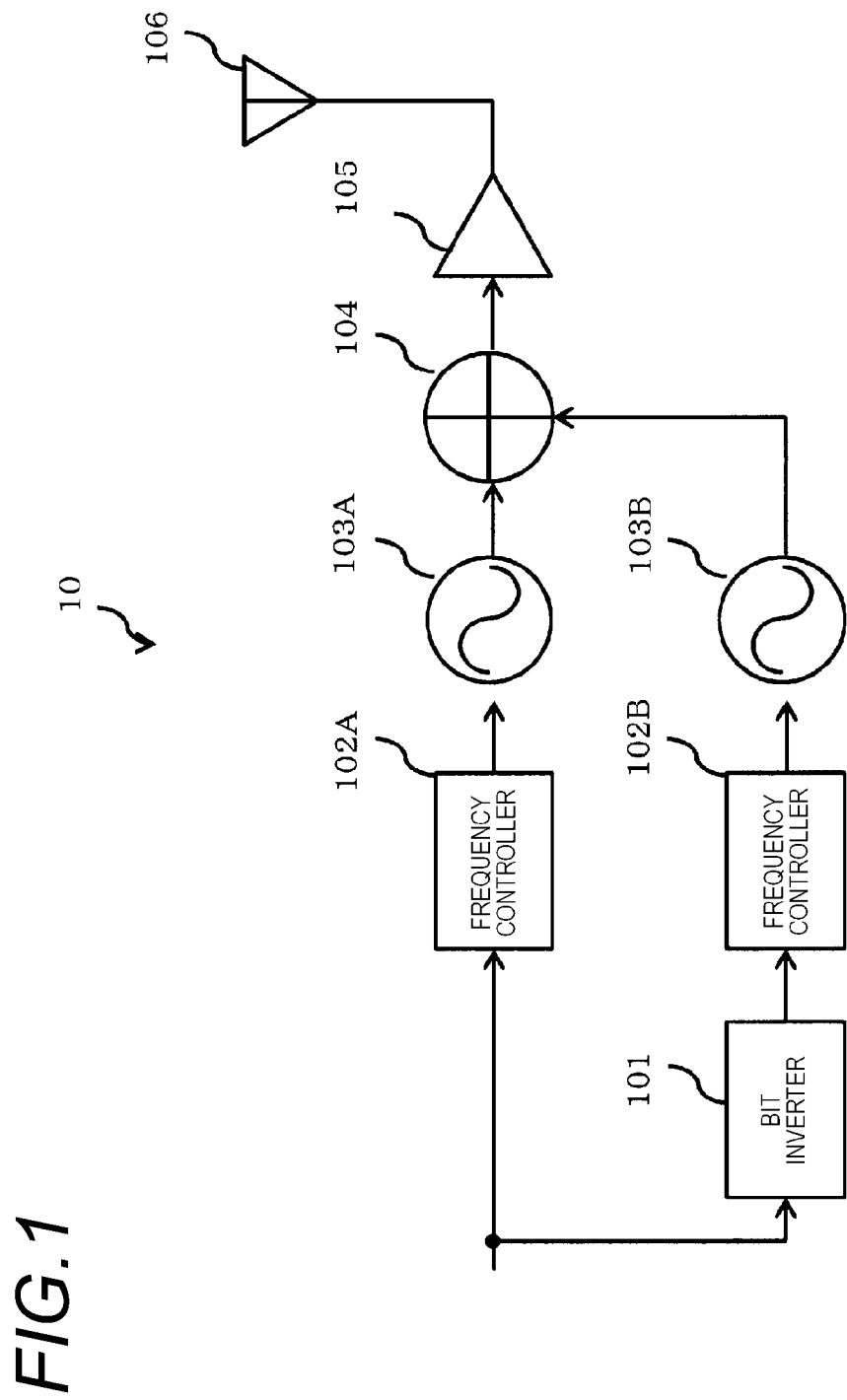
FIG. 1 is a block diagram illustrating a configuration example of a transmission apparatus in a first embodiment.

FIG. 1 is a block diagram illustrating a configuration example of a transmission apparatus 10 in a first embodiment. The transmission apparatus 10 includes a bit inverter 101, frequency controllers 102A and 102B, frequency synthesizers 103A and 103B, a mixing device 104, a power amplifier 105, and an antenna 106.

The bit inverter 101, the frequency controllers 102A and 102B, the frequency synthesizers 103A and 103B, the mixing device 104, and the power amplifier 105 function as a modulator that modulates a data signal to generate a transmission signal.

The bit inverter 101 receives the data signal to invert the bits of the data signal, and outputs the inverted data signal to the frequency controller 102B. In the bit inversion, for example, when data 0 (a data signal is "0") is received, data 1 (a data signal is "1") is output, and when data 1 is received, data 0 is output.

Hie frequency controller 102A receives the data signal. The frequency controller 102A adds or subtracts a predetermined frequency deviation df to or from a predetermined center frequency $f_{CA}$ of the data signal, according to the bit information of the data signal (for example, "0" or "1") to calculate a frequency $f_{modA}$. The frequency controller 102A outputs the information of the frequency $f_{modA}$ to the frequency synthesizer 103A.

For example, when the input data signal is "0", it is established that the frequency $f_{modA}=f_{CA}-df$, and when the input data signal is "1", it is established that the frequency $f_{modA}=f_{CA}+df$. The channel of the center frequency $f_{CA}$ is an example of a first wireless communication channel.

The frequency controller 102B receives the inverted data signal. The frequency controller 102B adds or subtracts a predetermined frequency deviation df to or from a predetermined center frequency $f_{CB}$ of the data signal, according to the bit information of the inverted data signal to calculate a frequency $f_{modB}$. The frequency controller 102B outputs the information of the frequency $f_{modB}$ to the frequency synthesizer 103B.

For example, when the input inverted data signal is "0", it is established that the frequency $f_{modB}=f_{CB}+df$, and when the input inverted data signal is "1", it is established that the frequency $f_{modB}=f_{CB}-df$. The channel of the center frequency $f_{CB}$ is an example of a second wireless communication channel.

Accordingly, it may be said that data 0 is annexed (assigned) to a difference between the frequency $f_{modB}=f_{CB}+df$ and the frequency $f_{modA}=f_{CA}-df$ of a carrier. It may be said that data 1 is annexed to a difference between the frequency $f_{modB}=f_{CB}-df$ and the frequency $f_{modA}=f_{CA}+df$.

The frequency synthesizer 103A receives information of the frequency $f_{modA}$ from the frequency controller 102A, and outputs a high frequency signal of a frequency corresponding to the frequency $f_{modA}$. The frequency controller 102A outputs the high frequency signal that is frequency-modulated by the frequency $f_{modA}$ varying with the passage of time (time-varying), to the mixing device 104. The frequency synthesizer 103A is an example of a modulation signal generator and a first modulation signal generator. The high frequency signal of a frequency corresponding to the frequency $f_{modA}$ is an example of a first modulation signal.

The frequency synthesizer 103B receives information of the frequency $f_{modB}$ from the frequency controller 102B, and outputs a high frequency signal of a frequency corresponding to the frequency $f_{modB}$. The frequency controller 102B outputs the high frequency signal that is frequency-modulated by the frequency $f_{modB}$ varying with the passage of time (time-varying) to the mixing device 104. The frequency synthesizer 103B is an example of a modulation signal generator and a second modulation signal generator. The high frequency signal of a frequency corresponding to the frequency $f_{modB}$ is an example of a second modulation signal.

The scheme of the frequency synthesizers 103A and 103B is, for example, a Phase Locked Loop (PLO scheme.

The mixing device 104 receives two high frequency signals from the frequency synthesizers 103A and 103B, and outputs a synthesized signal of the two high frequency signals, to the power amplifier 105.

The power amplifier 105 receives the synthesized signal from the mixing device 104, and outputs a high frequency signal that is amplified according to a predetermined gain, to the antenna 106.

The antenna 106 receives the amplified high frequency signal from the power amplifier 105, and transmits the high frequency signal as a wireless signal. The wireless signal is an example of a transmission signal.

By using two frequency synthesizers 103A and 103B, two frequency modulation signals of which the frequency deviation from the respective center frequencies is df may be simultaneously generated in two wireless channels of which center frequencies are frequencies $f_{CA}$ and $f_{CB}$.

Figure 2:
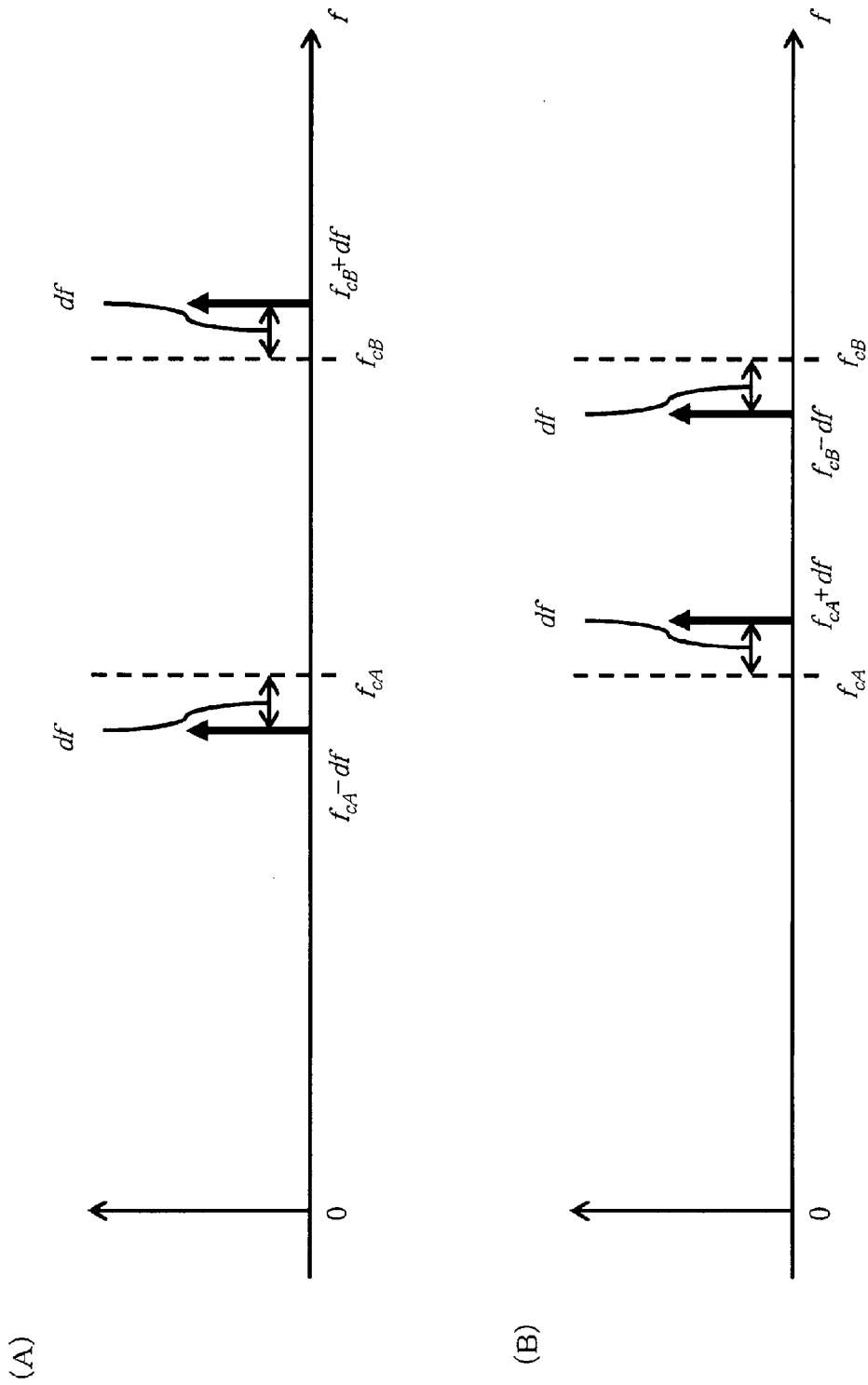
In FIG. 2, (A) and (B) are schematic diagrams each illustrating an example of a transmission frequency spectrum of a high frequency signal in the first embodiment.

In FIG. 2, (A) is a schematic diagram illustrating an example of a transmission frequency spectrum in the case of data 0. In FIG. 2, (B) is a schematic diagram illustrating an example of a transmission frequency spectrum in the case of data 1.

In (A) of FIG. 2, in the case of data 0, the frequency spectrum is present at the frequency $f_{CA}$-df and the frequency $f_{CB}$+df, and the difference between two frequencies is $f_{CB}$-$f_{CA}$+2*df. From (B) of FIG. 2, in the case of data 1, the frequency spectrum is present at the frequency $f_{CA}$+df and the frequency $f_{CB}$-df, and the difference between two frequencies is $f_{CB}$-$f_{CA}$-2*df.

Alternatively, the center frequency $f_{CA}$ may be a frequency higher than the center frequency $f_{CB}$. In this case, a difference between the center frequencies is $f_{CA}$-$f_{CB}$.

Figure 3:
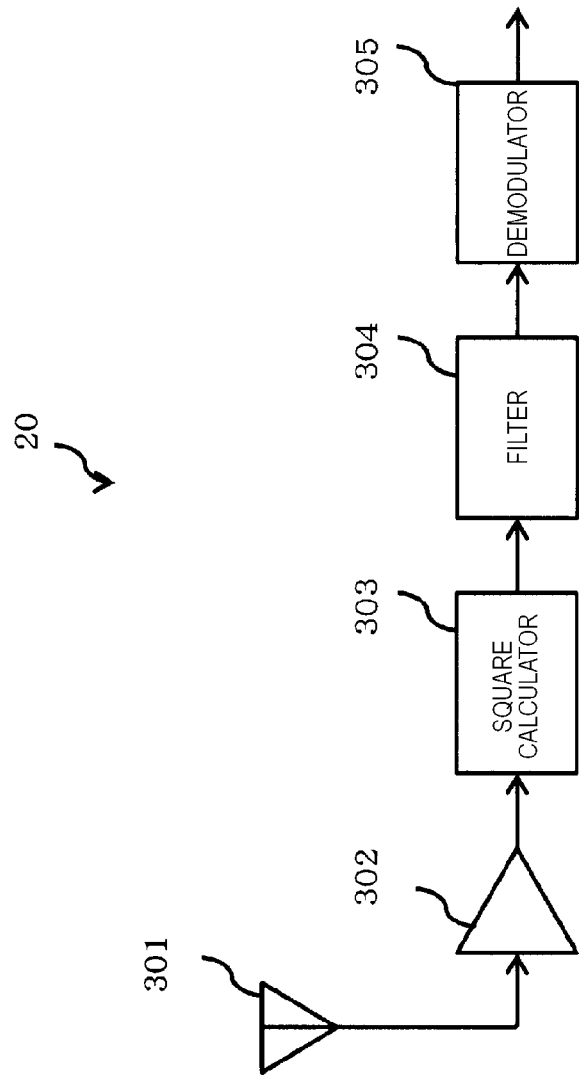
FIG. 3 is a block diagram illustrating a configuration example of a reception apparatus in the first embodiment.

FIG. 3 is a block diagram illustrating a configuration example of a reception apparatus 20 in the first embodiment.

The reception apparatus 20 includes an antenna 301, LNA 302, a square calculator 303, a filter 304, and a demodulator 305.

The LNA 302, the square calculator 303, the filter 304, and the demodulator 305 have a function as a demodulator that demodulates a reception signal to obtain a data signal.

The antenna 301 receives a wireless signal transmitted to the air, and outputs the reception signal to the LNA 302. The reception signal includes the data signal.

The LNA 302 receives the reception signal from the antenna 301 to amplify the signal according to a predetermined gain value, and outputs the amplified signal to the square calculator 303.

The square calculator 303 receives the amplified signal from the LNA 302 to calculate the square of the amplified signal, and outputs the squared signal to the filter 304. The square calculator 303 is an example of an intermodulation component deriving unit.

When a frequency modulation signal (amplified signal) that is modulated by a frequency deviation df in one wireless channel with one center frequency fc is squared, the square calculator 303 derives a square signal shown in the following Expression (1).

$$\cos^2(2*\pi*(f_c \pm df)*t) = (1+\cos(2*\pi*2*(f_c \pm df)*t))/2 \quad \text{(Expression 1)}$$

Where asterisk "*" represents multiplication.

Figure 4:
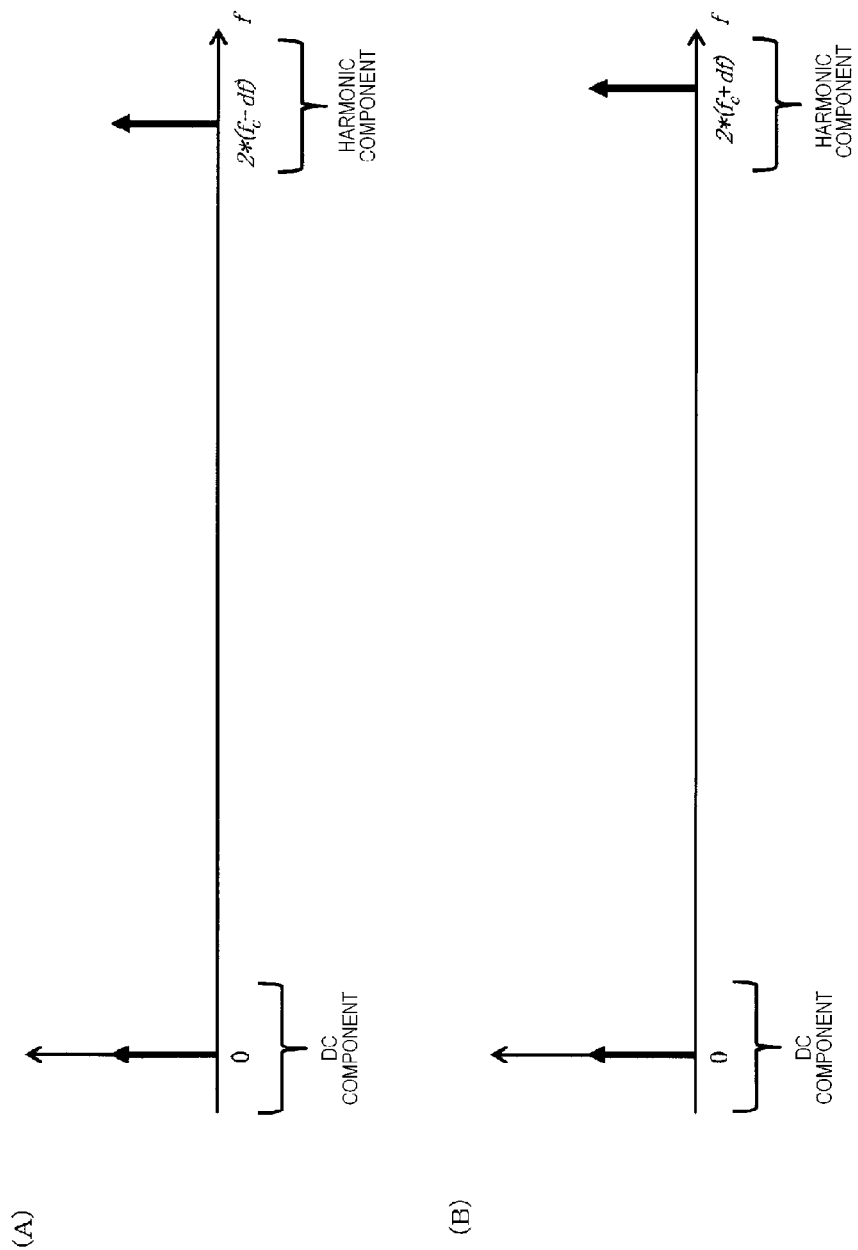
In FIG. 4, (A) and (B) are schematic diagrams each illustrating an example of a frequency spectrum after a square calculation is performed on a reception signal in a case of using one channel in the first embodiment.

DC components and harmonic components appear as square signals, as illustrated in (A) of FIG. 4 when the data signal is "0", and as illustrated in (B) of FIG. 4 when the data signal is "1". Accordingly components other than the DC components do not appear in the vicinity of a baseband, and thus it is not possible to identify a frequency modulation signal (data signal "1" or "0").

In the case of squaring two frequency modulation signals that are generated by the transmission apparatus 10 and modulated by the frequency deviation df in two wireless channels with center frequencies $f_{CA}$ and $f_{CB}$, the square calculator 303 derives a square signal including a DC component, a double harmonic component, and an intermodulation component. For example, when a synthesized signal (amplified signal) with the frequencies $f_{CA}$-df and $f_{CA}$+df which are illustrated in (A) of FIG. 2 is squared, the square calculator 303 derives a square signal shown in the following Expression (2).

(Expression 2)

Figure 5:
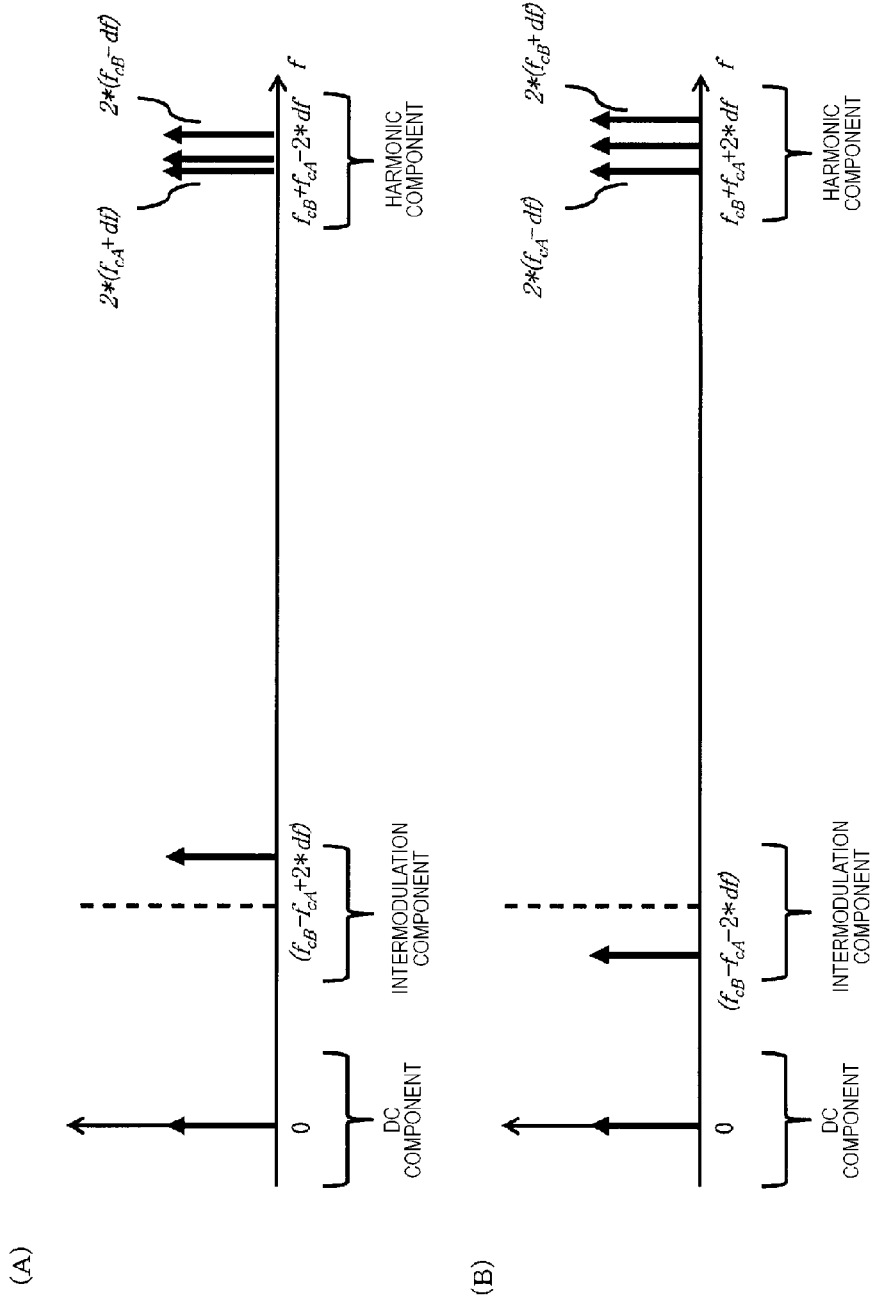
In FIG. 5, (A) and (B) are schematic diagrams each illustrating an example of a frequency spectrum after the square calculation is performed on the reception signal in a case of using two channels in the first embodiment.

$\{\cos(2*\pi*(f_{CA}-df)*t)+\cos(2*\pi*(f_{CB}+df)*t)\}^2$
$= \{\cos^2(2*\pi*(f_{CA}-df)*t)$
$+ 2\cos(2*\pi*(f_{CA}-df)*t)\cos(2*\pi*(f_{CB}+df)*t)$
$+ \cos^2(2*\pi*(f_{CB}+df)*t)$
$= \cos^2(2*\pi*(f_{CA}-df)*t)$
$+ \cos(2*\pi*(f_{CB}-f_{CA}+2*df)*t)$
$+ \cos(2*\pi*(f_{CA}+f_{CB}+2*df)*t)$
$+ \cos^2(2*\pi*(f_{CB}+df)*t)$
$= 1+\cos(2*\pi*2*(f_{CA}-df)*t)/2$
$+ \cos(2*\pi*(f_{CB}-f_{CA}+2*df)*t)$
$+ \cos(2*\pi*(f_{CA}+f_{CB}+2*df)*t)$
$+ \cos(2*\pi*2*(f_{CB}+df)*t)/2$ In other words, as illustrated in (A) of FIG. 5, when the DC component and the double harmonic component are removed from the square signal obtained by squaring the synthesized signal with frequencies $f_{CA}$+df and $f_{CB}$-df, the component $\cos(2*\pi*(f_{CB}-f_{CA}+2*df)*t)$ remains. $\cos(2*\pi*(f_{CB}-f_{CA}+2*df)*t)$ is the intermodulation component.

Similarly, as illustrated in (B) of FIG. 5, if the DC component and the double harmonic component are removed from the square signal obtained by squaring the synthesized signal of frequencies $f_{CA}$+df and $f_{CB}$-df, the component $\cos(2*\pi*(f_{CB}-f_{CA}-2*df)*t)$ remains. $\cos(2*\pi*(f_{CB}-f_{CA}-2*df)(*t)$ is the intermodulation component.

Accordingly, when focusing on the intermodulation component (intermodulation signal) of the square signal, it is possible to obtain a signal that is frequency-modulated by the center frequency $f_{CB}$-$f_{CA}$ and the frequency deviation 2*df.

Since the reference frequencies on the transmission side and the reception side are different, in the frequency conversion using a mixer in the related art, a frequency offset occurs. Meanwhile, the center frequency of the intermodulation signal to be demodulated by the reception apparatus 20 is frequency $f_{CB}$-$f_{CA}$, and is the center frequency difference of two wireless channels that is generated by the transmission apparatus 10. When a signal is generated by the common transmission apparatus 10, the center frequency difference is constant. Accordingly, frequency shift does not occur in the transmission apparatus 10 and the reception apparatus 20, and thus it is possible to omit the frequency offset estimation.

The square calculator 303 corresponds to an envelope detection unit used in an amplitude modulation (for example, On Off keying: OOK) scheme, and can operate with low power consumption.

The filter 304 receives a square signal from the square calculator 303. The filter 304 filters the square signal so as to pass the frequency band at which the intermodulation component of the square signal is generated, and outputs the band-limited signal to the demodulator 305. The frequency band at which the intermodulation component is generated is a frequency band with the center frequency $f_{CB}-f_{CA}$ and the bandwidth of 2*df or more.

The demodulator 305 receives the band-limited signal from the filter 304. The demodulator 305 performs a demodulation operation on the band-limited signal with the center frequency $f_{CB}-f_{CA}$ and the bandwidth of 2*df or more to demodulate the data signal. In other words, the demodulation object of the demodulator 305 is different from the frequency modulation signal with the center frequency $f_{CA}$ or $f_{CB}$ and the frequency deviation df, as modulation parameters of the transmission apparatus 10. The demodulator 305 is an example of the intermodulation component demodulator.

In this manner, the transmission apparatus 10 frequency-modulates a data signal of one wireless channel and an inverted data signal obtained by inverting a data signal of the other wireless channel, out of two wireless channels, and transmits a high frequency signal.

According to the transmission apparatus 10, the data signal is assigned to a frequency difference of two frequencies, and thus the reception apparatus 20 can perform demodulation by using an intermodulation component obtained by a square calculation. Accordingly, the reception apparatus 20 does not need to include an LO signal oscillator having difficulty in reducing power consumption, and it is possible to reduce power consumption of the reception apparatus 20 that demodulates a high frequency signal.

Further, the data signal and the inverted data signal of two wireless channels are used, and thus in addition to the DC component and the harmonic component, an intermodulation component can be shown in the reception apparatus 20. In the case of frequency modulation, there is no difference in signal amplitude, and thus it is not possible to identify the bit information of the data signal by using the DC component, but it is also possible to identify the bit information by using the intermodulation component. Although the circuit size of the reception apparatus 20 is increased in the case of demodulation using the harmonic component, the demodulation is possible in a frequency band lower than the high frequency by using the intermodulation component, and thus it is possible to prevent an increase in the circuit size.

Further, since the reception apparatus 20 performs demodulation by using the intermodulation component, the frequency offset between the transmission apparatus 10 and the reception apparatus 20 does not occur, such that there is no need of frequency offset estimation, thereby further reducing power consumption.

Further, the reception apparatus 20 demodulates the intermodulation component that is generated by performing a square calculation of the signal obtained by frequency-modulating the data signal of one wireless channel and the inverted data signal of the other wireless channel, out of two wireless channels. In this case, the square calculator 303 performs frequency conversion that can be implemented at low power that is a characteristic of the envelope detection scheme.

According to the reception apparatus 20, the reception signal includes the data signal assigned to the frequency difference between two frequencies and thus can generate the intermodulation component based on the reception signal. Since demodulation is performed by using the intermodulation component, it is not necessary to include an LO signal oscillator having difficulty in reducing power consumption, thereby reducing power consumption of the reception apparatus 20 that demodulates the frequency modulation signal. Further, since the demodulation is performed by using the intermodulation component, a frequency offset between the transmission apparatus 10 and the reception apparatus 20 does not occur, such that there is no need of frequency offset estimation, thereby further reducing power consumption.

Second Embodiment

Figure 6:
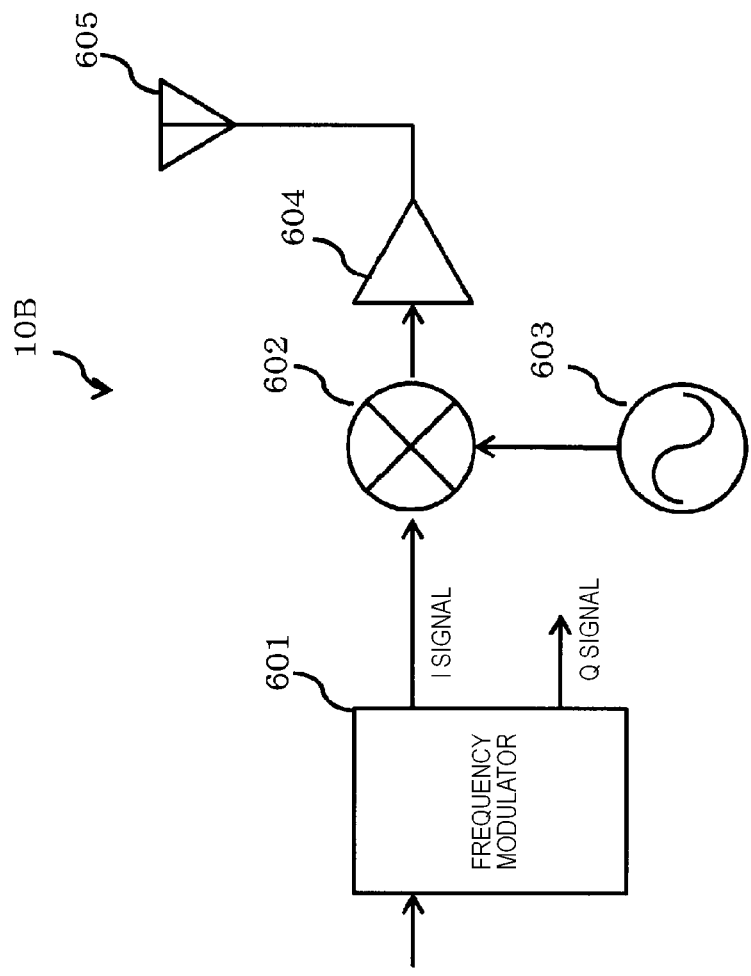
FIG. 6 is a block diagram illustrating a configuration example of a transmission apparatus in a second embodiment.

FIG. 6 is a block diagram illustrating a configuration example of a transmission apparatus 10B in a second embodiment. The transmission apparatus 10B includes a frequency modulator 601, a mixer 602, a frequency synthesizer 603, a power amplifier 604, and an antenna 605.

The frequency modulator 601 receives a data signal, and derives a frequency modulation signal with a center frequency $(f_{CB}-f_{CA})/2$ and a frequency deviation df according to the data signal. The frequency modulator 601 outputs a real axis signal of a complex signal of the derived frequency modulation signal, as a transmission I (in-phase) signal, and outputs an imaginary axis signal of the complex signal, as a transmission Q (quadrature) signal.

The frequency synthesizer 603 receives information of a predetermined frequency to generate an LO signal that is a tone signal of a predetermined frequency and outputs the LO signal to the mixer 602.

The mixer 602 receives the transmission I signal from the frequency modulator 601 and the LO signal from the frequency synthesizer 603. The mixer 602 multiplies the transmission I signal and the LO signal, and outputs a high frequency signal to the power amplifier 604.

Here, the transmission apparatus 10B intentionally does not use the transmission Q signal. Since the frequency modulation signal not including the transmission Q signal vibrates on a real axis in an IQ plane, there is a frequency component that reversely rotates, in addition to a frequency component that normally rotates on the IQ plane. In other words, as illustrated in (A) and (B) of FIG. 7, the frequency spectrum of the frequency modulation signal has a negative frequency component, in addition to a positive frequency component. The negative frequency component is present at a position symmetrical to the frequency position of the positive frequency component, relative to the origin. The amplitude of the negative frequency component is the same as the amplitude of the positive frequency component.

In (A) of FIG. 7, when the frequency component of the frequency modulation signal includes $(f_{CB}-f_{CA})/2+df$, the negative frequency component is generated at $[-(f_{CB}-f_{CA})/2-df]$. In FIG. 7, (A) illustrates the case in which for example, the data signal is data 0.

In (B) of FIG. 7, when the frequency component of the frequency modulation signal includes $(f_{CB}-f_{CA})/2-df$, the negative frequency component is generated at $[-(f_{CB}-f_{CA})/2+df]$. In FIG. 7, (B) illustrates the case in which for example, the data signal is data 1.

In addition, the transmission Q signal may be used while the transmission I signal is not used.

Figure 8:
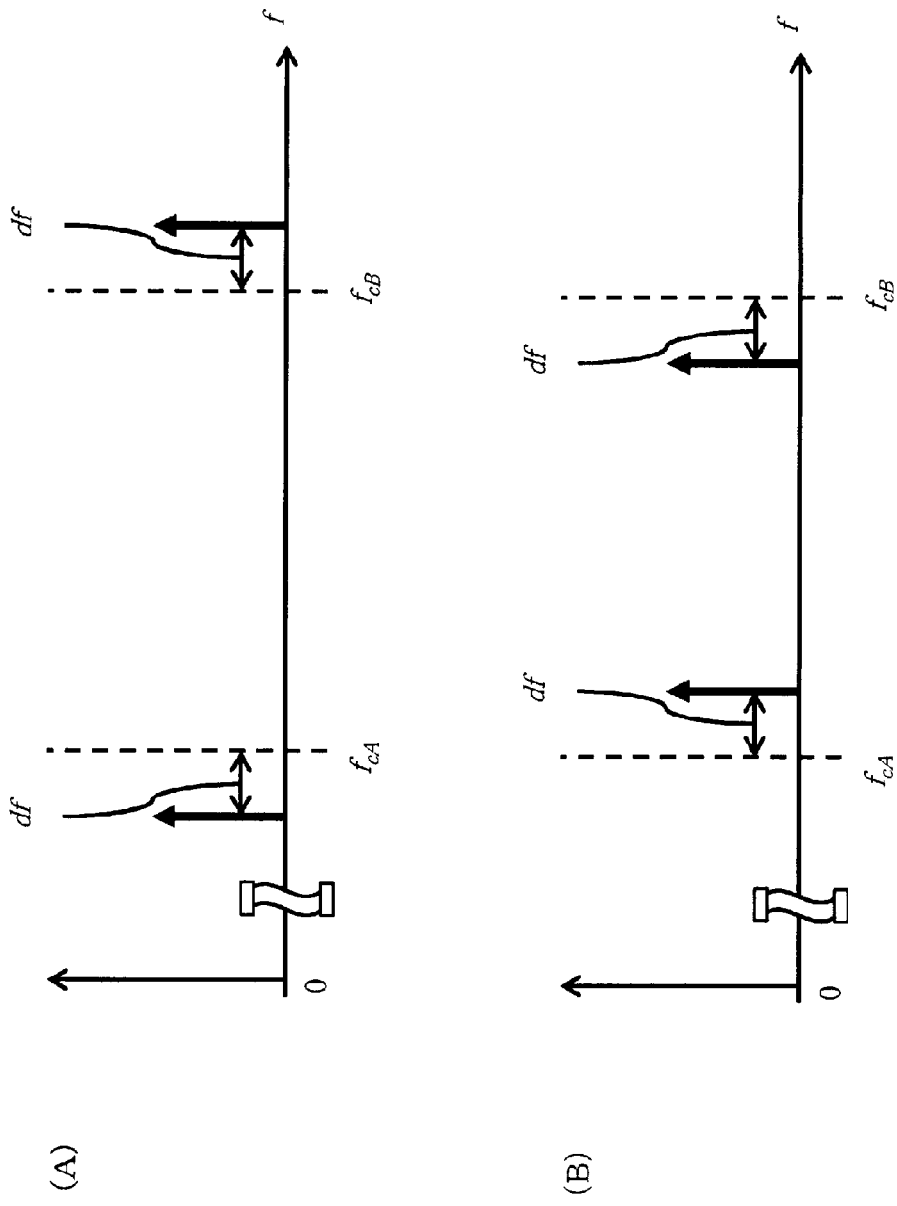
In FIG. 8, (A) and (B) are schematic diagrams each illustrating an example of a transmission frequency spectrum of a high frequency signal in the second embodiment.

The mixer 602 frequency-converts the frequency modulation signal including the transmission I signal, that is, positive and negative frequency components, and derives a high frequency signal. In the case of the frequency modulation signal illustrated in (A) of FIG. 7, the frequency spectrum of the high frequency signal is generated at the position of frequencies $f_{CA}-df$ and $f_{CB}+df$ shown in (A) of FIG. 8. For example, the high frequency signal including the component of the frequency $f_{CA}-df$ is an example of a first modulation signal, the high frequency signal including the component of frequency $f_{CB}$+df is an example of a second modulation signal. Further, in the case of the frequency modulation signal illustrated in (B) of FIG. 7, the frequency spectrum of the high frequency signal is generated at the position of frequencies $f_{CB}$+df and $f_{CB}$−df shown in (B) of FIG. 8. In other words, the mixer 602 performs frequency conversion by multiplying the frequency modulation signal and $(f_{CA}+f_{CB})/2$, and obtains a high frequency signal.

Accordingly, it may be said that for example, data 0 is added to a difference between the frequency $f_{CB}$+df and the frequency $f_{CA}$−df. It may be said that data 1 is added to a difference between the frequency $f_{CB}$−df and the frequency $f_{CA}$+df.

The power amplifier 604 receives the high frequency signal from the mixer 602 to amplify the high frequency signal according to a predetermined gain, and outputs the amplified high frequency signal to the antenna 605.

The antenna 605 receives the amplified high frequency signal from the power amplifier 604, and transmits the high frequency signal as a wireless signal.

Figure 9:
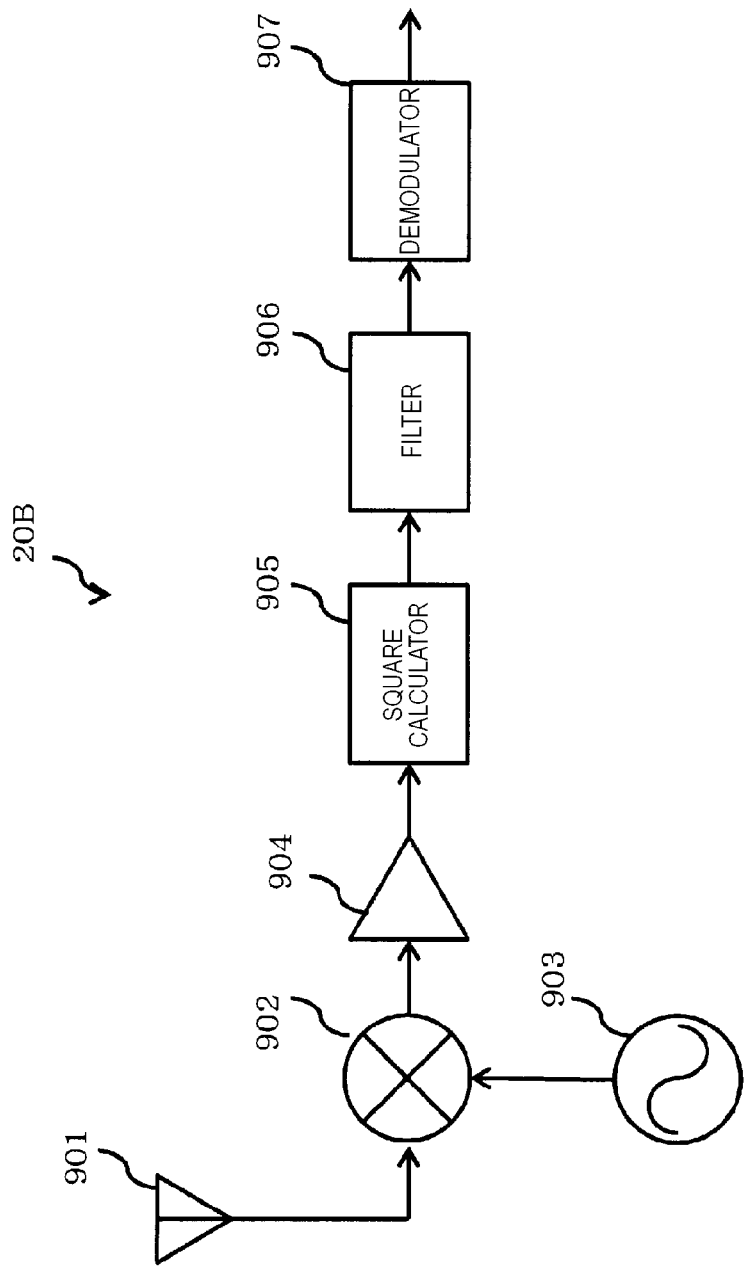
FIG. 9 is a block diagram illustrating a configuration example of a reception apparatus in the second embodiment.

FIG. 9 is block diagram illustrating a configuration example of a reception apparatus 20B in the second embodiment. The reception apparatus 20B includes an antenna 901, a mixer 902, arm LO signal oscillator 903, an IF-LNA 904, a square calculator 905, a filter 906, and a demodulator 907.

The antenna 901 receives a wireless signal transmitted to the air, and outputs the reception signal to the mixer 902.

The LO signal oscillator 903 receives information of a predetermined frequency to generate an LO signal (local oscillator signal) which is a tone signal of a predetermined frequency, and outputs the LO signal to the mixer 902.

In addition, the frequency accuracy of the LO signal generated by the LO signal oscillator 903 is a few %, and is lower as compared to a few to a few tens of ppm which is the normally required frequency accuracy. Accordingly, the LO signal oscillator 903 can operate with low power consumption of a micro watt order.

The mixer 902 receives the reception signal from the antenna 901 and the LO signal from the LO signal oscillator 903. The mixer 902 frequency-converts the reception signal which is a high frequency signal into an Intermediate Frequency (IF) band signal by multiplying the reception signal and the LO signal, and outputs the reception IF signal to an IF-LNA 904. The intermediate frequency band is an example of a predetermined frequency band.

The IF-LNA 904 receives the reception. IF signal from the mixer 902 to amplify the reception IF signal according to a predetermined gain value, and outputs the amplified IF signal to the square calculator 905. It is possible to amplify the reception signal with low power consumption, by amplifying the reception signal in an IF band, instead of in a Radio Frequency (RF) band (high frequency band).

The square calculator 905 receives the amplified IF signal from the IF-LNA 904 to derive the square of the amplified IF signal, and outputs a square signal to the filter 906.

The filter 906 receives the square signal from the square calculator 905, filters the square signal so as to pass the frequency band in which the intermodulation component of the square signal is generated, and outputs the band-limited signal to the demodulator 907. The frequency band in which the intermodulation component is generated is a frequency band with the center frequency $f_{CB}-f_{CA}$ and a bandwidth of 2*df or more.

The demodulator 907 receives the band-limited signal from the filter 906. The demodulator 907 demodulates the data signal by performing a demodulation operation of the band-limited signal with the center frequency $f_{CB}-f_{CA}$ and the frequency deviation 2*df. In other words, the demodulation target of the demodulator 907 is different from a frequency modulation signal with the center frequency $f_{CA}$ or $f_{CB}$ and the frequency deviation as a modulation parameter of the transmission apparatus 10B.

Next, demodulation by a general reception apparatus will be described.

Since the frequency accuracy is low in the LO signal generated by the signal oscillator, the LO signal is in an indeterminate state in which the center frequency is unstable. For example, in (A) of FIG. 10, there is a possibility that the frequency $f_{LO}$ of the LO signal varies $f_{LO} \to f'_{LO} \to f''_{LO}$ with the passage of time, and varies over the frequency deviation df. Accordingly there is a possibility that the center frequency $f_{IF}$ varies with the passage of time in the reception signal which is frequency-converted by using the LO signal, as illustrated in (B) of FIG. 10.

Figure 10:
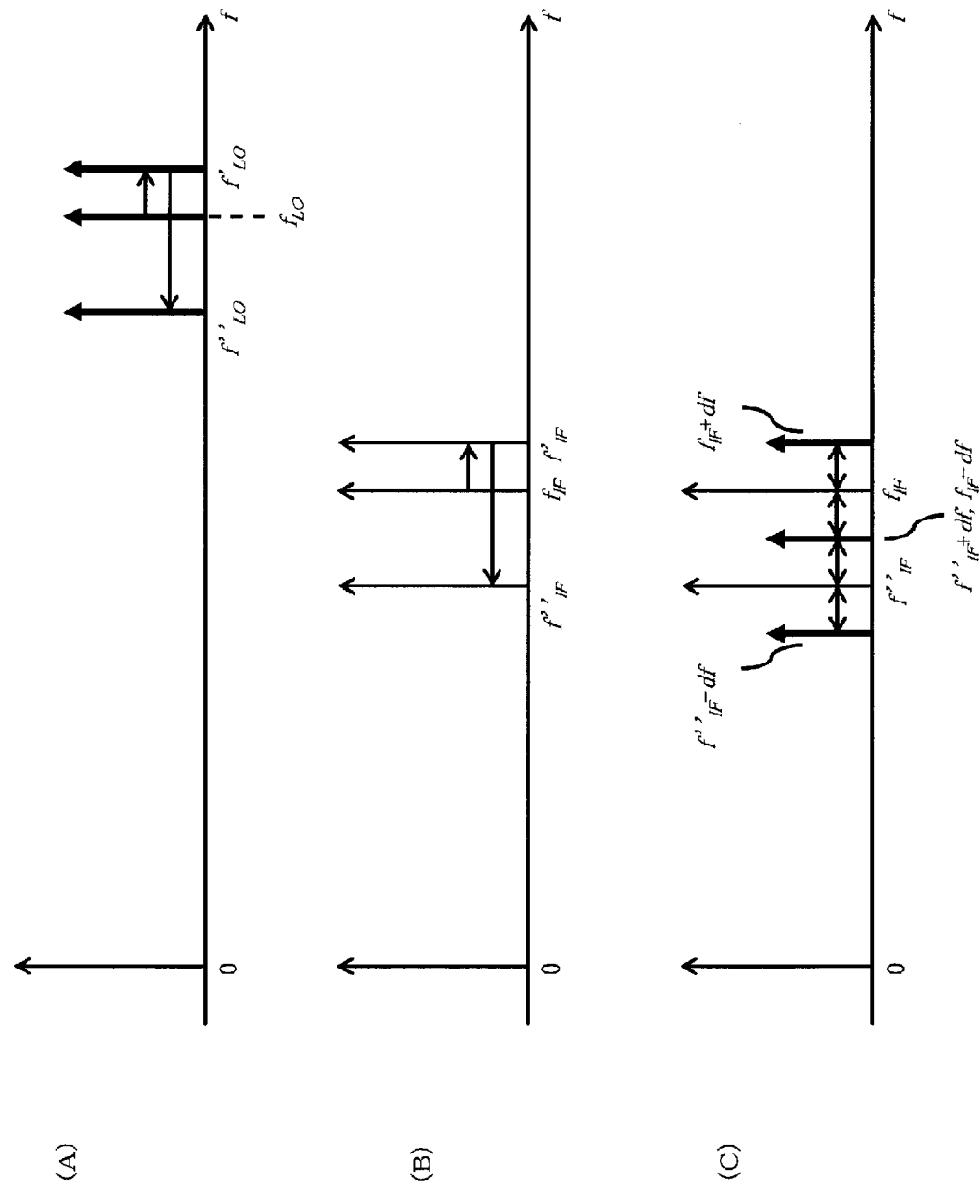
In FIG. 10, (A) to (C) are schematic diagrams each describing low frequency accuracy of an LO signal oscillator in the second embodiment.

In FIG. 10, (C) is a schematic diagram illustrating an example of a frequency spectrum of the reception IF signal, when the center frequency of the IF band is two frequencies $f_{IF}$ and $f'_{IF}$, and the difference between two frequencies is $f_{IF}-f'_{IF}=2*df$.

In (C) of FIG. 10, a frequency component $f_{IF}$−df is shown in the case where the center frequency of the IF band is converted into a frequency $f_{IF}$ in a signal representing data 0 in which the frequency deviation is −df. Further, In (C) of FIG. 10, a frequency component $f'_{IF}$−df is shown in the case where the center frequency of the IF band is converted into a frequency $f'_{IF}$ in a signal representing data 1 in which the frequency deviation is +df. In ((C) of FIG. 10, the frequency components $f_{IF}$−df and $f'_{IF}$−df match. In this case, the demodulator is not able to correctly demodulate the data signal.

In this manner, since frequency accuracy is low, and the frequency components of two channels overlap and the demodulation accuracy deteriorates, the LO signal oscillator uses the LO signal with high frequency accuracy in many cases. In this case, power consumption increases in the reception apparatus.

Next, demodulation by the reception apparatus 20B will be described.

The reception apparatus 20B receives a wireless signal including two frequency modulation signals in which the frequency deviation is df, in two wireless channels with the center frequency of the frequencies $f_{CA}$ and $f_{CB}$. Further, the reception apparatus 20B frequency-converts the reception signal into the reception IF signal by using the LO signal with low frequency accuracy.

Figure 11:
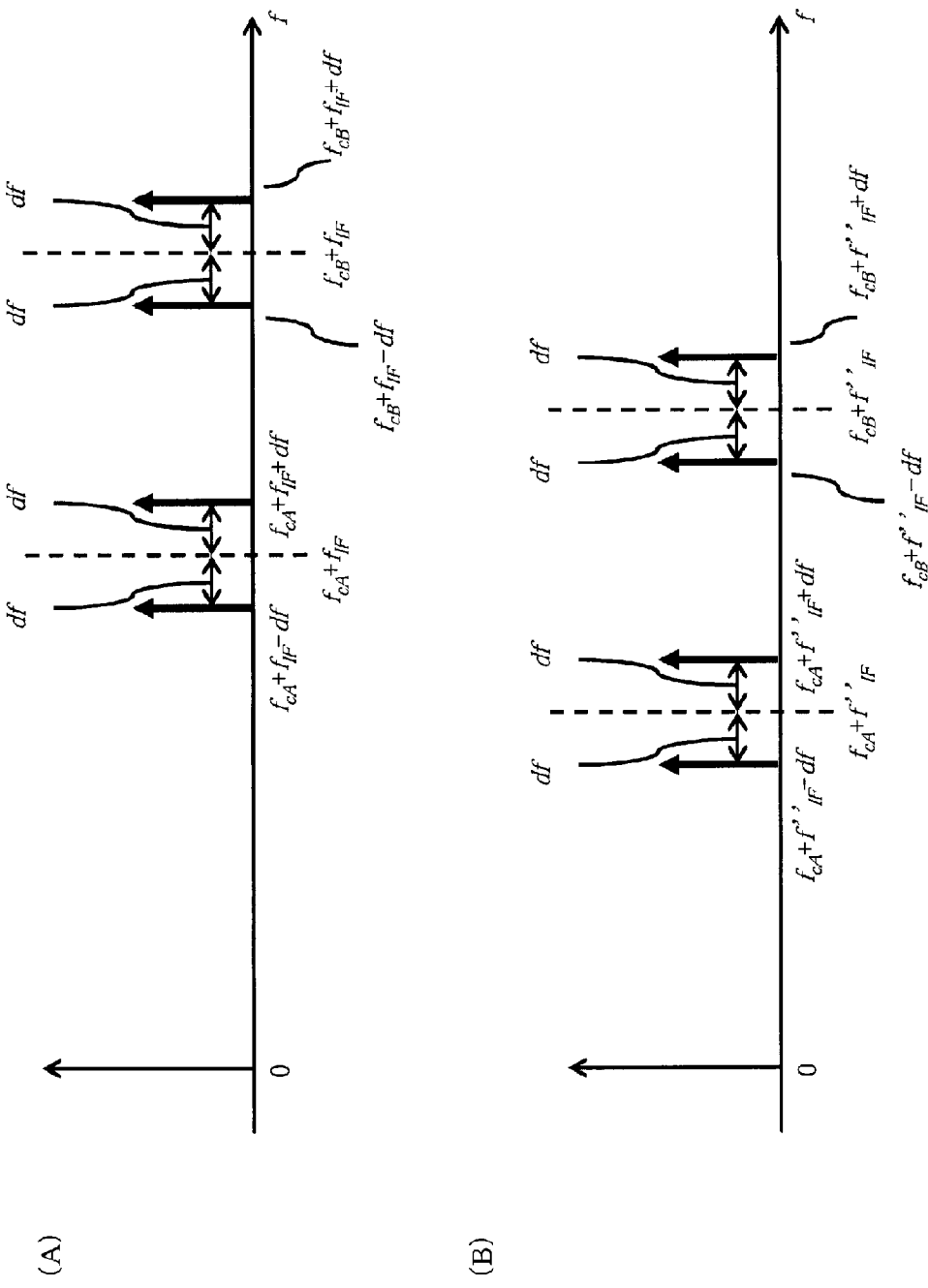
In FIG. 11, (A) and (B) are schematic diagrams each illustrating an example of a frequency spectrum of a reception IF signal obtained through a frequency conversion using an LO signal.

In FIG. 11, (A) is a schematic diagram illustrating an example of a frequency spectrum of a reception IF signal obtained through a frequency conversion using the LO signal $f_{LO}$. In (A) of FIG. 11, four frequency spectra are drawn for convenience, but actually, there are two frequency components of the frequency $f_{CA}+f_{IF}$−df and the frequency $f_{CB}+f_{IF}$+df, or the frequency $f_{CA}+f_{IF}$+df and the frequency $f_{CB}+f_{IF}$−df.

Further, in FIG. 11, (B) is a schematic diagram illustrating an example of a frequency spectrum of the reception IF signal obtained through a frequency conversion using the LO signal $f'_{LO}$.

As illustrated in (A) and (B) of FIG. 11, the frequency of an absolute reception IF signal is determined by the LO signal, but the frequency difference between the center frequencies of two channels is the frequency difference $(f_{CB}-f_{CA})$ before the frequency conversion in an IF band. Accordingly, the intermodulation component which is generated by the square calculator 905 squaring the reception IF signal is regarded to be a reception IF signal which is frequency-demodulated by the center frequency $f_{CB}-f_{CA}$ and the frequency deviation $2*df$. Further, the intermodulation component is normally generated at the same frequency regardless of the time change of the LO signal.

Accordingly although the reception apparatus 20B includes the LO signal oscillator 903 with low frequency accuracy the intermodulation component is normally generated at the same frequency and thus it is possible to prevent deterioration of the demodulation accuracy by demodulating the intermodulation component.

In this manner, the transmission apparatus 10B generates a negative frequency component corresponding to a positive frequency component of a transmission I signal, without specially providing a second channel, by using any of the transmission I signal and the transmission Q signal. By frequency-converting the two frequency components, two frequency modulation signals with the frequency deviation df are generated in two wireless channels of which the center frequencies are the frequencies $f_{CA}$ and $f_{CB}$.

According to the transmission apparatus 10B, two data signals are created for one data signal, and a functional block for providing a second channel is not required, and thus it is possible to reduce the processing load of the transmission apparatus 10B. Further, a frequency modulation signal is generated by using the frequency components of two channels, and thus it is possible to perform demodulation with high accuracy by using the intermodulation component, in the reception apparatus 20B.

Further, the reception apparatus 20B frequency converts the reception signal (RF band signal) into an IF band signal, by using the LO signal oscillator 903 and the mixer 902. Thus, it is possible to improve an SN ratio of the reception signal, by amplifying the signal with low power consumption in the IF band.

Further, the reception apparatus 20B demodulates the intermodulation component which is generated by squaring the amplified IF signal. In this case, the intermodulation component is demodulated that is generated by the square calculator 905 can be implemented at low power, which is a characteristic of the envelope detection scheme. Thus, frequency conversion is possible while eliminating the influence of the LO signal oscillator 903 with low frequency accuracy, and it is possible to reduce power consumption of the reception apparatus 20B for demodulating the frequency modulation signal.

In addition, the reception apparatus of the present embodiment is not necessarily the reception apparatus 20B, and may be the reception apparatus 20 described in the first embodiment.

In addition, the reception apparatus 20B may be applied to the reception apparatus in the first embodiment.

Third Embodiment

In a third embodiment, for example, an Orthogonal Frequency Division Multiplexing (OFDM) modulation scheme is applied.

Figure 12:
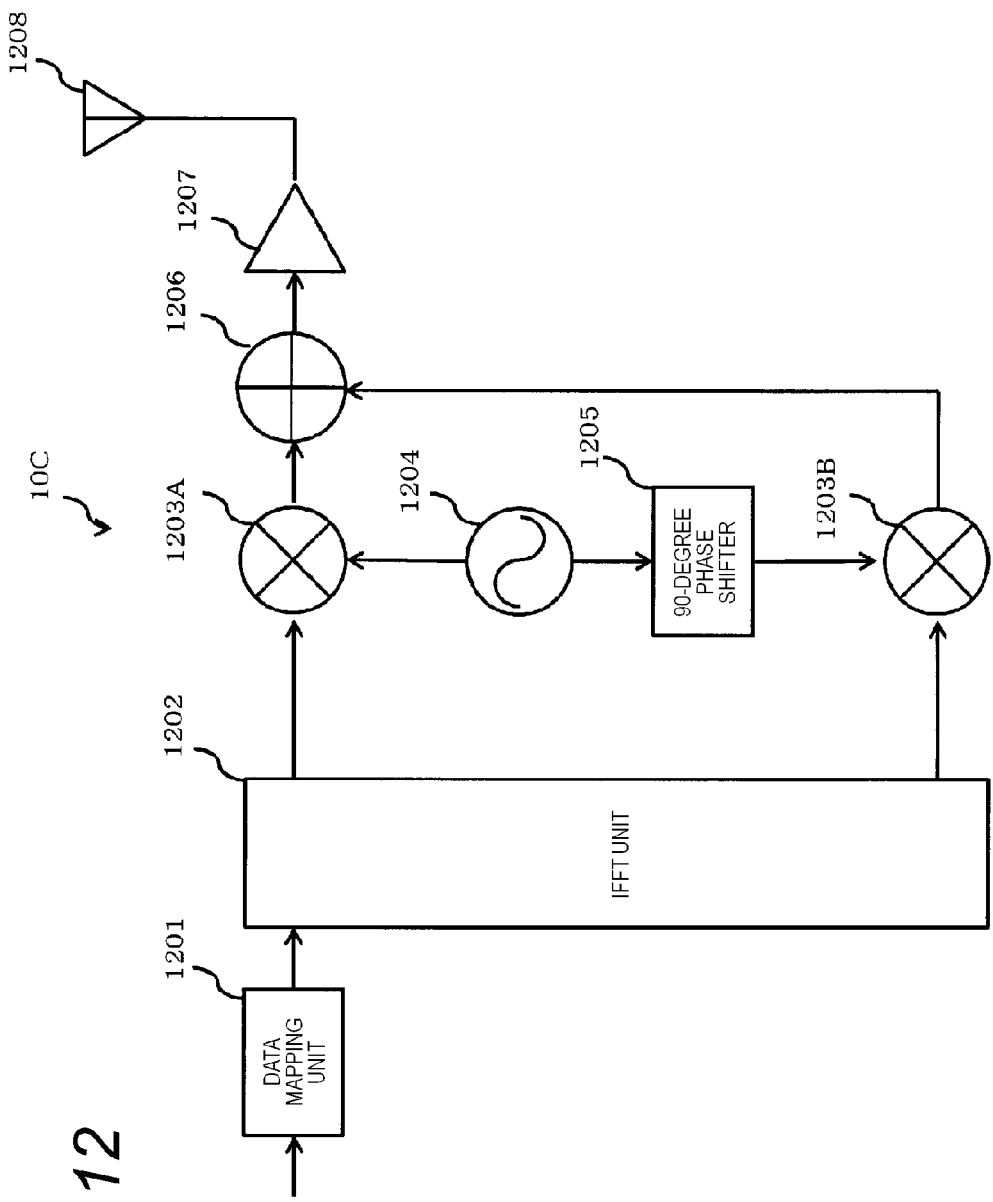
FIG. 12 is a block diagram illustrating a configuration example of a transmission apparatus in a third embodiment.

FIG. 12 is a block diagram illustrating a configuration example of a transmission apparatus 10C in a third embodiment. The transmission apparatus 10C includes a data mapping unit 1201 and an Inverse Fast Fourier Transform (IFFT) unit 1202. Further, the transmission apparatus 10C includes mixers 1203A and 1203B, a frequency synthesizer 1204, a 90-degree phase shifter 1205, a mixing device 1206, a power amplifier 1207, and an antenna 1208.

The data mapping unit 1201 receives a data signal, distributes the signal to two subcarriers according to the data signal, and outputs subcarrier information to an IFFT unit. For example, when the data signal is "0", the amplitude of the subcarriers of the frequencies $f_{CA}-df$ and $f_{CB}+df$ is assumed to be "1", and the amplitudes of other subcarriers are assumed to be "0". Further, for example, when the data signal is "1", the amplitude of the subcarriers of the frequencies $f_{CA}+df$ and $f_{CB}-df$ is assumed to be "1", and the amplitudes of other subcarriers are assumed to be "0".

In other words, the data mapping unit 1201 maps a data signal to the subcarrier in the same frequency position as that of the frequency used in the frequency modulation of the first embodiment. Further, it may be said that data 0 is added to a difference between the frequency $f_{modB}=f_{CB}+df$ and the frequency $f_{modA}=f_{CA}-df$. It may be said that data 1 is added to a difference between the frequency $f_{modB}=f_{CB}-df$ and the frequency $f_{modA}=f_{CA}+df$.

The IFFT unit 1202 receives subcarrier information from the data mapping unit 1201. The IFFT unit 1202 converts subcarrier information which is a signal on a frequency axis into a baseband complex signal which is a signal on a time axis, by performing IFFT on the subcarrier information. The IFFT unit 1202 outputs a real axis signal of a baseband complex signal as a transmission I signal, to the mixer 1203A. The IFFT unit 1202 outputs an imaginary axis signal of the baseband complex signal as a transmission Q signal, to the mixer 1203B. The transmission I signal is an example of the first modulation signal, and the transmission Q signal is an example of the second modulation signal.

The frequency synthesizer 1204 receives information of a predetermined frequency, generates an LO signal which is a tone signal of a predetermined frequency, and outputs the LO signal to the mixer 1203A and the 90-degree phase shifter 1205.

The 90-degree phase shifter 1205 receives the LO signal from the frequency synthesizer 1204. The 90-degree phase shifter 1205 generates a 90-degree phase difference LO signal which is a signal having a 90-degree phase difference with respect to the LO signal, and outputs the 90-degree phase difference LO signal to the mixer 1203B.

The mixer 1203A receives the transmission I signal from the MT unit 1202 and the LO signal from the frequency synthesizer 1204, and outputs a high frequency I signal to the mixing device 1206, by multiplying the transmission I signal and the LO signal.

The mixer 1203B receives the transmission signal from the IFFT unit 1202 and the 90-degree phase difference LO signal from the 90-degree phase shifter 1205, and outputs a high frequency Q signal to the mixing device 1206, by multiplying the transmission Q signal and the 90-degree phase difference LO signal.

The mixing device 1206 receives the high frequency I signal from the mixer 1203A and the high frequency Q signal from the mixer 1203B, and outputs a synthesized signal of the high frequency I signal and the high frequency Q signal to the power amplifier 1207.

The power amplifier 1207 receives the synthesized signal from the mixing device 1206, amplifies the synthesized signal according to a predetermined gain, and outputs the amplified high frequency signal to the antenna 1208.

The antenna 1208 receives the amplified high frequency signal from the power amplifier 1207, and transmits the high frequency signal as a wireless signal.

The reception apparatus of the present embodiment is the same as the afore-mentioned reception apparatus 20 or the reception apparatus 20B, and thus the description thereof will be omitted.

In this manner, the transmission apparatus 10C frequency-converts signals while putting the signals on the subcarriers on which non-inverted data signals are put and the subcarriers on which inverted data signals are put, in two wireless channels, and transmits the high frequency signal. In this case, two frequency modulation signals are generated with a frequency deviation df in the two wireless channels with center frequencies $f_{CA}$ and $f_{CB}$, by using the IFFT.

According to the transmission apparatus 10C, the reception apparatus 20 can perform demodulation by using an intermodulation component by a square calculation. Accordingly, in the reception apparatus 20, it is not necessary to include an LO signal oscillator having difficulty in reducing power consumption, and it is possible to reduce power consumption of the reception apparatus 20 that demodulates a high frequency signal. Further, since the reception apparatus 20 performs demodulation by using the intermodulation component, a frequency offset between the transmission apparatus 10 and the reception apparatus 20 does not occur, such that there is no need of frequency offset estimation and it is possible to further reduce power consumption.

In addition, in the case of the reception apparatus 20B, the effect described in the second embodiment is achieved.

According to the transmission apparatus or the reception apparatus in each embodiment, it is possible to reduce power consumption of the reception apparatus that demodulates the frequency modulation signal. Further, it is possible to reduce power consumption of a sensor wireless network system including the transmission apparatus or the reception apparatus.

The present disclosure is not limited to the above configurations of the embodiments, and any configuration can also be applied as far as the configuration can achieve the functions described in the claims or the functions included in the configuration of the present embodiment.

Although cases in which the present disclosure is configured by hardware have been described in the above embodiments, the present disclosure may also be implemented by software in cooperation with the hardware.

Further, the respective functional blocks employed in the description of the above embodiment are typically implemented as an LSI which is an integrated circuit. The functional blocks may be individually made into single chips respectively, or may be made into a single chip including an entirety or a part. Herein, the chip may be an LSI, and it may be called an IC, a system LSI, a super LSI, or an ultra LSI, depending on the degree of integration.

Further, a circuit integrating method is not limited to an LSI, but may be implemented by a dedicated circuit or a general-purpose processor. For example, a Field Programmable Gate Array (FPGA) that can be programmed after a LSI has been manufactured, and a reconfigurable processor in which connection between circuit cells in the LSI or setting can be reconfigured may be used.

Further, when a circuit integrating technology replacing an LSI appears with the advance or derivative of a semiconductor technology, naturally, functional blocks may be integrated by using the technologies. There is a possibility of applying a bio-technology.

(Summary of Aspects of Disclosure)

A transmission apparatus according to a first aspect of the resent disclosure includes:

a modulator that modulates a data signal to generate a transmission signal, in which the modulator modulates the data signal by assigning the data signal to a frequency difference between a first frequency and a second frequency in a carrier.

The transmission apparatus according to a second aspect of the present disclosure is a transmission apparatus according to the first aspect, in which the modulator includes:

a modulation signal generator that generates a first modulation signal according to the first frequency and a second modulation signal according to the second frequency, based on the data signal, and a transmission signal generator that generates the transmission signal according to the first modulation signal and the second modulation signal which are generated by the modulation signal generator, and the first frequency is a predetermined frequency higher than a center frequency of a first wireless communication channel and the second frequency is the predetermined frequency lower than a center frequency of a second wireless communication channel, or the first frequency is the predetermined frequency lower than the center frequency of the first wireless communication channel and the second frequency is the predetermined frequency higher than the center frequency of the second wireless communication channel.

The transmission apparatus according to a third aspect of the present disclosure is a transmission apparatus according to the second aspect, in which the modulation signal generator includes;

a first modulation signal generator that generates the first modulation signal by frequency-modulating the data signal by using the first frequency; and a second modulation signal generator that generates the second modulation signal by frequency-modulating the data signal by using the second frequency.

The transmission apparatus according to a fourth aspect of the present disclosure is a transmission apparatus according to the second aspect, in which the modulation signal generator generates the first modulation signal by frequency-modulating the data signal by using a positive frequency component of any one of an I signal and a Q signal of a complex signal corresponding to a signal that is obtained by frequency-modulating the data signal, and generates the second modulation signal by frequency-modulating the data signal by using a negative frequency component of any one of the I signal and the Q signal.

The transmission apparatus according to a fifth aspect of the present disclosure is a transmission apparatus according to the second aspect, in which the modulation signal generator generates the first modulation signal by using a first subcarrier located at the first frequency, and generates the second modulation signal by using a second subcarrier located at the second frequency.

A reception apparatus according to a first aspect of the present disclosure includes:

a demodulator that demodulates a reception signal to acquire a data signal, in which the demodulator demodulates the reception signal for which the data signal is assigned to a frequency difference between a first frequency and a second frequency in a carrier.

The reception apparatus according to a second aspect of the present disclosure is a reception apparatus according to the first aspect, in which
the demodulator includes;
an intermodulation component deriving unit that derives an intermodulation component of a square signal obtained by squaring the reception signal; and
an intermodulation component demodulator that demodulates the intermodulation component of the square signal.

The reception apparatus according to a third aspect of the present disclosure is a reception apparatus according to the second aspect, in which
the intermodulation component deriving unit includes a square calculator that squares the reception signal.

The reception apparatus according to a fourth aspect of the present disclosure is a reception apparatus according to the second or third aspect, including:
a local oscillator that generates a local oscillator signal;
a frequency converter that frequency-converts the reception signal to a signal in a predetermined frequency band, based on the reception signal and the local oscillator signal; and
an amplifier that amplifies a signal in the predetermined frequency band, which is frequency-converted by the frequency converter, in which
the intermodulation component deriving unit derives an intermodulation component of the square signal obtained by squaring the signal in the predetermined frequency band amplified by the amplifier.

A reception apparatus according to the present disclosure includes:
a transmission apparatus that generates a transmission signal by modulating a data signal by assigning the data signal to a frequency difference between a first frequency and a second frequency in a carrier, and transmits the transmission signal; and
a reception apparatus that receives and demodulates the transmission signal to acquire the data signal.

A transmission method according to the present disclosure includes:
a modulation step of modulating a data signal to generate a transmission signal, and
in the modulation step, the data signal is modulated while being assigned to a frequency difference between a first frequency and a second frequency in a carrier.

A reception method according to the present disclosure includes:
a demodulation step of demodulating a reception signal to acquire a data signal, and
in the demodulation step, the reception signal, for which the data signal is assigned to a frequency difference between a first frequency and a second frequency in a carrier, is demodulated.

Although the present disclosure has been described in detail or with reference to the specific embodiments, it is obvious that various changes or modifications shall be appreciated by a person having an ordinary skill without departing from the spirit and scope of the present disclosure.

The present disclosure is based on Japanese Patent Application No. 2013-048351 filed on Mar. 11, 2013, the contents of which are incorporated herein by reference.

INDUSTRIAL APPLICABILITY

The present disclosure is useful as a transmission apparatus, a reception apparatus, a transmission method, and a reception method in which it is possible to reduce power consumption of the reception apparatus.

REFERENCE SIGNS LIST 10, 10B, 10C: TRANSMISSION APPARATUS
20, 20B: RECEPTION APPARATUS
101: BIT INVERTER
102A, 102B: FREQUENCY CONTROLLER
103A, 103B: FREQUENCY SYNTHESIZER
104: MIXING DEVICE
105: POWER AMPLIFIER
106: ANTENNA
301: ANTENNA
302: INA
303: SQUARE CALCULATOR
304: FILTER
305: DEMODULATOR
601: FREQUENCY MODULATOR
602: MIXER,
603: FREQUENCY SYNTHESIZER
604: POWER AMPLIFIER
605: ANTENNA
901: ANTENNA
902: MIXER
903: LO SIGNAL OSCILLATOR
904: IF-LNA
905: SQUARE CALCULATOR
906: FILTER
907: DEMODULATOR
1201: DATA MAPPING UNIT
1202: IFFT UNIT
1203A, 1203B: MIXER
1204: FREQUENCY SYNTHESIZER
1205: 90-DEGREE PHASE SHIFTER
1206: MIXING DEVICE
1207: POWER AMPLIFIER
1208: ANTENNA

The invention claimed is:

1. A transmission apparatus comprising:
modulation circuitry, which in operation, modulates each of data bits by assigning a plurality of data bits to one of: a pair of a frequency of f1−df and a frequency of f2+df, and a pair of a frequency of f1+df and a frequency of f2−df to generate a transmission data sequence; and
transmission circuitry, which in operation, transmits the transmission data sequence, wherein
each of the data bits is assigned by a reception apparatus to either +2df or −2df with a frequency of f2−f1 as a center frequency.

2. The transmission apparatus according to claim 1, wherein the modulation circuitry includes:
first modulation signal generation circuitry, which in operation, generates a first modulation signal by frequency-modulating each of the data bits by using the frequency of f1−df or the frequency of f1+df;
second modulation signal generation circuitry, which in operation, generates a second modulation signal by frequency-modulating each of inverted data bits, which inverts each of the data bits, by using the frequency of f2+df or the frequency of f2−df; and
transmission data sequence generation circuitry, which in operation, generates the transmission data sequence according to the first modulation signal and the second modulation signal.

3. The transmission apparatus according to claim 2, wherein the modulation circuitry outputs either an I (in-phase) signal or a Q (quadrature) signal of the first modulation signal as a positive frequency component, and outputs either an I signal or a Q signal of the second modulation signal as a negative frequency component.

4. The transmission apparatus according to claim 2, wherein the modulation circuitry generates the first modulation signal by using a first subcarrier located at the frequency f1, and generates the second modulation signal by using a second subcarrier located at the frequency f2.

5. A reception apparatus comprising:
reception circuitry, which in operation, receives a data sequence in which each data bits is assigned to one of: a pair of a frequency of f1−df and a frequency of f2+df, and a pair of a frequency of f1+df and a frequency of f2−df; and
demodulation circuitry, which in operation, demodulates the received data sequence to acquire the data bits, wherein
the demodulation circuitry includes:
intermodulation component deriving circuitry, which in operation, derives an intermodulation component of a square signal obtained by squaring the received data sequence; and
intermodulation component demodulation circuitry, which in operation, demodulates the intermodulation component of the square signal which assigns each of the data bits in either +2df or −2df with the frequency of f2−f1 as the center frequency.

6. The reception apparatus according to claim 5, wherein the intermodulation component deriving circuitry includes a square calculating circuitry, which in operation, squares the reception signal.

7. The reception apparatus according to claim 5, comprising:
local oscillation circuitry, which in operation, generates a local oscillation signal;
frequency conversion circuitry, which in operation, frequency-converts the reception signal to a signal in a determined frequency band, based on the reception signal and the local oscillation signal; and
amplification circuitry, which in operation, amplifies the signal in the determined frequency band, which is frequency-converted by the frequency conversion circuitry, wherein
the intermodulation component deriving circuitry derives an intermodulation component of the square signal obtained by squaring the signal in the determined frequency band amplified by the amplification circuitry.

8. A communication system comprising:
a transmission apparatus, which in operation, transmits a transmission data sequence; and
a reception apparatus, which in operation, receives the transmission data sequence from the transmission apparatus,
wherein the transmission apparatus comprises:
modulation circuitry, which in operation, modulates each of data bits by assigning a plurality of data bits to one of: a pair of frequency of f1−df and a frequency of f2+df, and a pair of a frequency of f1+df and a frequency of f2−df to generate the transmission signal; and
transmission circuitry, which in operation, transmits the transmission data sequence, wherein
each of the data bits is assigned by the reception apparatus to either +2df or −2df with a frequency of f2−f1 as a center frequency, and
wherein the reception apparatus comprises:
reception circuitry, which in operation, receives the transmission data sequence in which each of the data bits is assigned to the one of: the pair of the frequency of f1−df and the frequency of f2+df, and the pair of the frequency of f1+df and the frequency of f2−df; and
demodulation circuitry, which in operation, demodulates the received data sequence to acquire the data bits, wherein
the demodulation circuitry includes:
intermodulation component deriving circuitry, which in operation, derives an intermodulation component of a square signal obtained by squaring the received data sequence; and
intermodulation component demodulation circuitry, which in operation, demodulates the intermodulation component of the square signal which assigns each of the data bits in either +2df or −2df with the frequency f2−f1 as the center frequency.

9. A transmission method comprising:
modulating, by a modulation circuitry, each of data bits by assigning a plurality of data bits to one of: a pair of a frequency of f1−df and a frequency of f2+df, and a pair of a frequency of f1+df and a frequency of f2−df to generate a transmission data sequence; and
transmitting, by a transmission circuitry, the transmission data sequence;
wherein each of the data bits is assigned by a reception apparatus to either +2df or −2df with a frequency of f2−f1 as center frequency.

10. A reception method comprising:
receiving, by a reception circuitry, a data sequence in which each of data bits is assigned to one of: a pair of a frequency of f1−df and a frequency of f2+df, and a pair of a frequency of f1+df and a frequency of f2−df;
demodulating, by a demodulation circuitry, the received data sequence to acquire the data bits;
deriving, by an intermodulation component deriving circuitry included in the demodulation circuitry, an intermodulation component of a square signal obtained by squaring the received data sequence; and
demodulating, by an intermodulation component demodulation circuitry included in the demodulation circuitry, the intermodulation component of the square signal which assigns each of the data bits in either +2df or −2df with a frequency of f2−f1 as a center frequency.

* * * * *